(12) United States Patent
Wickramanayaka et al.

(10) Patent No.: US 7,816,283 B2
(45) Date of Patent: Oct. 19, 2010

(54) METHOD OF DEPOSITING A HIGHER PERMITTIVITY DIELECTRIC FILM

(75) Inventors: Sunil Wickramanayaka, Tokyo (JP); Naoki Yamada, Tokyo (JP)

(73) Assignee: Canon Anelva Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 11/141,044

(22) Filed: Jun. 1, 2005

(65) Prior Publication Data

US 2005/0272196 A1    Dec. 8, 2005

(51) Int. Cl.
*H01L 21/31* (2006.01)
*H01L 21/469* (2006.01)

(52) U.S. Cl. ............... 438/785; 438/591; 438/786; 257/E21.625; 257/E21.639

(58) Field of Classification Search ........ 438/400, 438/216, 591, 778, 781, 785, 786, FOR. 287, 438/FOR. 400, FOR. 401, FOR. 405, FOR. 396, 438/FOR. 202; 257/E21.192, E21.193, E21.267, 257/E21.169, E21.292, E21.625, E21.639
See application file for complete search history.

(56) References Cited

U.S. PATENT DOCUMENTS

| | | | |
|---|---|---|---|
| 5,114,556 A * | 5/1992 | Lamont, Jr. ............ | 204/192.12 |
| 5,780,908 A | 7/1998 | Sekiguchi et al. | |
| 6,013,553 A * | 1/2000 | Wallace et al. ............ | 438/287 |
| 6,291,866 B1 * | 9/2001 | Wallace et al. ............ | 257/410 |
| 6,306,743 B1 | 10/2001 | Lee | |
| 6,346,801 B1 * | 2/2002 | Zafarana et al. ............ | 323/284 |
| 6,358,788 B1 | 3/2002 | Chen et al. | |
| 6,440,797 B1 * | 8/2002 | Wu et al. ............ | 438/261 |
| 6,503,609 B1 * | 1/2003 | Lobl et al. ............ | 428/209 |
| 6,576,967 B1 * | 6/2003 | Schaeffer et al. ............ | 257/411 |
| 2002/0056864 A1 * | 5/2002 | Agarwal ............ | 257/296 |
| 2003/0113972 A1 | 6/2003 | Hayashi et al. | |
| 2004/0077165 A1 | 4/2004 | Armitage et al. | |
| 2004/0157473 A1 * | 8/2004 | Hayashi et al. ............ | 438/785 |
| 2005/0280099 A1 * | 12/2005 | Park et al. ............ | 257/374 |

FOREIGN PATENT DOCUMENTS

| | | |
|---|---|---|
| JP | 08-293494 | 11/1996 |
| JP | 11-168096 | 6/1999 |
| JP | 2003-249497 | 9/2003 |
| JP | 2004-266263 | 9/2004 |

OTHER PUBLICATIONS

English translation of Office Action issued on Apr. 1, 2008 in corresponding Japanese Patent Application No. 2004-160928.

\* cited by examiner

*Primary Examiner*—Matthew Smith
*Assistant Examiner*—Quovaunda Jefferson
(74) *Attorney, Agent, or Firm*—Buchanan Ingersoll & Rooney PC (57) ABSTRACT

A method of depositing a high permittivity dielectric film on a doped silicon or silicon compound layer of a wafer. The method includes a first step of nitriding a specific element (A) such as hafnium Hf to form a nitride film ($A_xN_y$) on the silicon layer, wherein the specific element (A) and nitrogen (N) in the nitride film ($A_xN_y$) have a predetermined fraction relationship between x and y; a second step of oxidizing the nitride film in a oxygen atmosphere to form the dielectric film (AON).

11 Claims, 11 Drawing Sheets

| Underlayer Thickness | HfN thickness | EOT | $V_{fb}$ | Leakage current at $V_{fb}$ |
|---|---|---|---|---|
| SiO2 (1.2 nm) | 0.5 nm | 1.63 nm | -0.71 V | $1.08 \times 10^{-3}$ A/cm$^{-2}$ |
| SiO2 (1.2 nm) | 1.0 nm | 1.81 nm | -1.04 V | $2.00 \times 10^{-6}$ A/cm$^{-2}$ |
| SiON (1.2 nm) | 0.5 nm | 1.79 nm | -0.91 V | $6.74 \times 10^{-6}$ A/cm$^{-2}$ |
| SiON (1.2 nm) | 1.0 nm | 1.66 nm | -0.95 V | $5.65 \times 10^{-6}$ A/cm$^{-2}$ |

METHOD OF DEPOSITING A HIGHER PERMITTIVITY DIELECTRIC FILM

BACKGROUND OF THE INVENTION

1. Field of the Invention

The present invention relates to a method of depositing a high permittivity dielectric film, and more particularly, a method of depositing a high permittivity dielectric film such as various oxide films or nitride films with very thin and uniform thickness on a silicon layer in a substrate.

2. Description of the Related Art

In making MOSFET devices on a silicon substrate, for example, the deposition of very thin films of dielectric materials with permittivity considerably higher than $SiO_2$ will be very important for future semiconductor devices. The thin higher permitittivity dielectric film is used as a gate-dielectric layer in the MOSFET, for example. In detail, the high permittivity dielectric materials are expected for use in two different applications. The first application is to replace currently widely using $SiO_2$, SiON and $Si_3N_4$ dielectric materials in CMOS transistor gate dielectrics. The second application is to fabricate capacitors with higher capacitance particularly for liquid crystal display panels.

At present there are two basic techniques in depositing high permittivity dielectric materials. The first method is chemical vapor deposition (CVD) and the second method is physical vapor deposition (PVD).

Even though there are many different techniques in depositing films by CVD method, basically two methods are widely used in industry. In the first technique, a chemical precursor, preferably a metal organic compound, is decomposed by a plasma or thermal energy and reacted with a suitable gas to form a desired higher permittivity dielectric material. This technique is usually referred to MO-CVD technique. In the second method, two chemical agents are introduced to a substrate alternately having a time-break in between each gas introduction. During the time-break, the first introduced gas is evacuated except molecules adsorbed on the substrate surface. When the second agent is introduced, it reacts with the surface adsorbed first gas molecules and forms a dielectric film. Then remaining excess gas is evacuated during the time break that goes until next gas introduction. This technique is referred to atomic layer deposition (ALD) technique.

There are two basic requirements in depositing the high permittivity dielectric films on the silicon substrate as the gate dielectric in the CMOS applications. The first requirement is that the film has to be very thin. For example, most of the future CMOS devices need films with a physical thickness less than 3 nm. The second requirement is that thickness of the films has to be extremely uniform, for example, less than 1% ($1\sigma$). Since these films are very thin, a slight non-uniform film significantly changes electrical properties, for example, capacitance and leakage current. With reference to these two basic requirements, demerits of above deposition techniques are discussed.

As one of conventional techniques there is JP-A-11-168096 disclosing a method of depositing high dielectric oxide films directly on silicon layers using a reactive sputtering method or CVD, for example. This method has been proposed for forming a high dielectric oxide film directly on the silicon layer without degrading the properties of the high dielectric oxide film, such as the high dielectric or insulation. In accordance with the above-mentioned conventional method, first, the high dielectric nitride film is formed on the silicon layer, and afterward the high dielectric nitride film is changed to become the high dielectric oxide film by oxidizing it.

When fabricating a very thin dielectric film used as a gate-dielectric layer in the MOSFET on the silicon substrate, a uniform dielectric film with a higher permitittivity is need to be deposited.

OBJECTS AND SUMMARY

An object of the present invention is to provide a method of depositing a dielectric film with a very thin thickness, high uniformity of film quality, and higher permittivity, in the MOSFET on the silicon substrate.

One embodiment of depositing a high permittivity dielectric film of the present invention is configured as follows in order to attain the above-mentioned object.

A method of depositing a high permittivity dielectric film on a doped silicon or silicon compound layer of a substrate is comprised of a first step of nitriding a specific element (A) to form a nitride film ($A_x N_y$) on the silicon layer, wherein the specific element (A) and nitrogen (N) in the nitride film ($A_x N_y$) have a predetermined fraction relationship between x and y; a second step of oxidizing the nitride film in an oxygen atmosphere to form the dielectric film (AON) which is oxidized and nitrided.

In the above-mentioned method, preferably, the specific element (A) is any one which belongs to the third, fourth or fifth family of the periodic table of the elements.

In the above-mentioned method, preferably, the specific element (A) and nitrogen (N) in the nitride film ($A_x N_y$) have a relationship that y is smaller than its stoichiometric value.

In the above-mentioned method, preferably, the specific element (A) is hafnium (Hf).

In the above-mentioned method, preferably, the hafnium (Hf) and nitrogen (N) in the nitride film ($Hf_x N_y$) have a relationship that $0<y<1.5$ for $x=1$.

In the above-mentioned method, preferably, the oxidization process in the second step is carried out through a thermal anneal process with a specific temperature included in a temperature range of 400-1000° C.

In the above-mentioned method, preferably, a reactive sputtering method is used for the film deposition.

In the above-mentioned method, preferably, any one of $SiO_2$, SiN, SION layers is arranged on said silicon layer first, then a high permittivity dielectric film (AON) is deposited.

In the above-mentioned method, preferably, in the first step a flow rate of nitrogen gas ($N_2$) supplied for a nitriding process is any value included in a range of 1-15 sccm.

In accordance with the present invention, a new technique is provided in depositing very thin and very uniform dielectric films by PVD and thermal annealing processes, in which films are not subjected to plasma induced damages. It has been shown that this technique yields higher permittivity dielectric films with EOT (equivalent oxide thickness)<1 nm with leakage current smaller than $10^{-1}$ A/cm$^2$.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Hereinafter, preferred embodiments will be explained according to the attached drawings. Through the explanation of the embodiments, the details of the present invention will be clarified.

Embodiment 1

Figure 1:
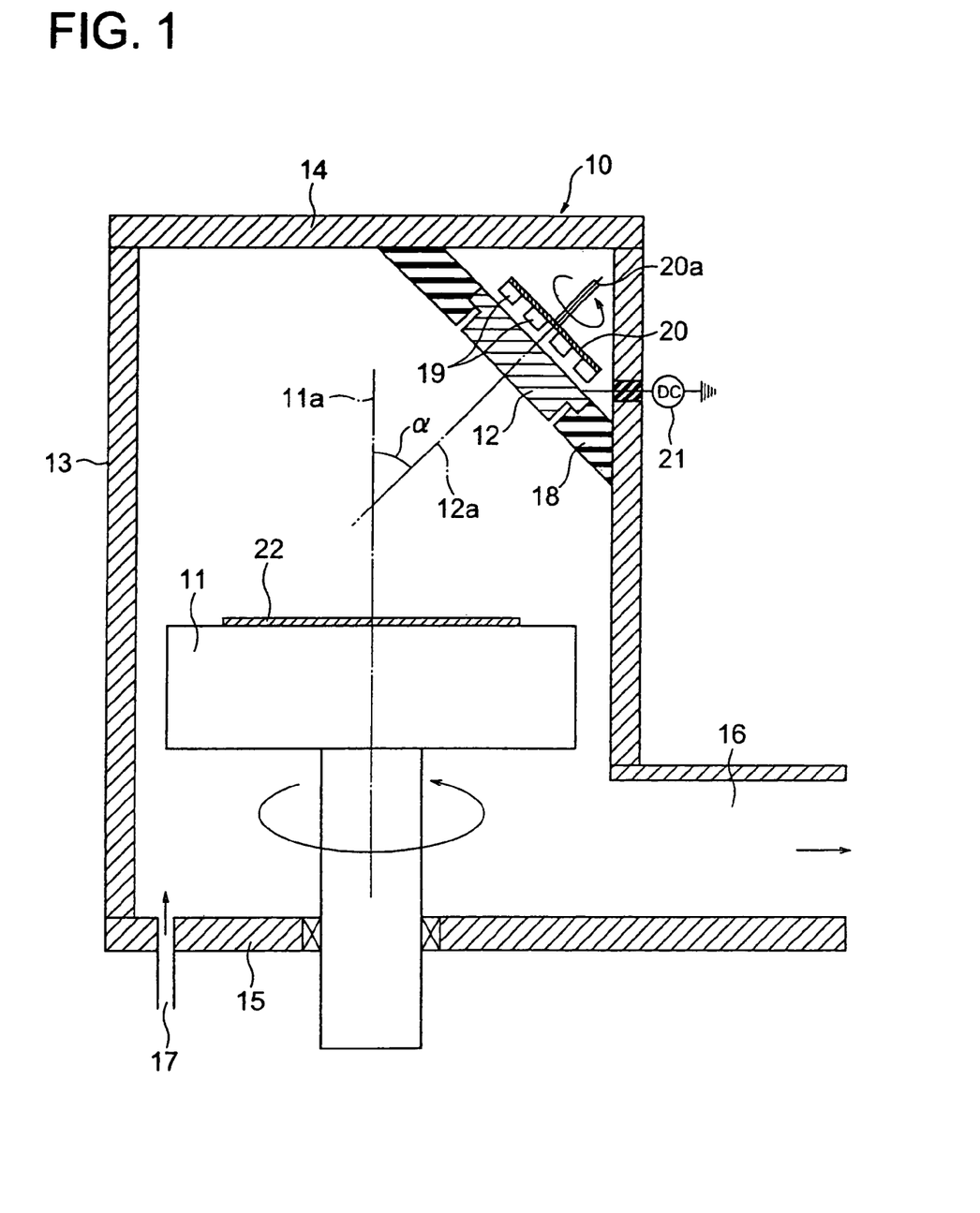
FIG. 1 is a schematic view of a DC magnetron PVD system used for HfN film deposition.

A first embodiment of the present invention is explained with reference to FIGS. 1 to 6. As one example, a schematic diagram of a PVD process chamber 10 is shown in FIG. 1. A method of depositing a high permittivity dielectric film in accordance with the present invention is carried out in order to form a gate insulation layer on the silicon wafer for making a gate electrode for MOSFET in the PVD process chamber.

First the structure of the PVD process chamber 10 is explained. This process chamber 10 is comprised of a wafer holder 11, a target 12 which is also called a cathode and of plate-shape, sidewalls 13, top plate 14, bottom plate 15, vacuuming port 16 and a gas inlet 17. The typical material of the target 12 is preferably hafnium (Hf). The target 12 is fixed to the walls or plates (13, 14) of the process chamber 10 through an insulator support plate 18. It is electrically isolated from the rest of the process chamber 10 by the insulator support plate 18. On the upper or side of the target 12, there is a magnet arrangement 19 fixed to a rotatable support plate 20. The support plate 20 has a drive mechanism that is not shown in the figure. A reference number 20a designates a rotation axis. During the operation, the magnet arrangement 19 is rotated by an electrical motor included in the drive mechanism. The electrical motor and rotating mechanism for the magnet arrangement 19 is not shown in the FIG. 1.

The above-mentioned target 12 is supplied with a DC electrical power to generate plasma from a DC power source 21. The use of the DC electrical power is not essential. Instead of the DC electrical power, a rf electrical power may be used to generate the plasma.

The target 12 is preferably made of hafnium (Hf) with the purity of 99.99%. The target 12 is placed with a preferred predetermined angle with respect to a wafer or substrate 22, which is placed on the wafer holder 11. Again, axes 11a and 12a of the wafer holder 11 and the target 12 are not parallel and intersect at a predetermined angle ($\alpha$). They exist in the same plane. The angle ($\alpha$) between these two axes 11a and 12a is smaller than 90°, and typically around 45°.

The wafer holder 11 is rotated with a rotation speed of about 60 rpm etc. during the film deposition on the wafer 22. The rotation speed is not critical and can be varied in a wider range, for example, the range of 10-500 rpm. The wafer holder rotation mechanism is not shown in the figure.

Figure 2:
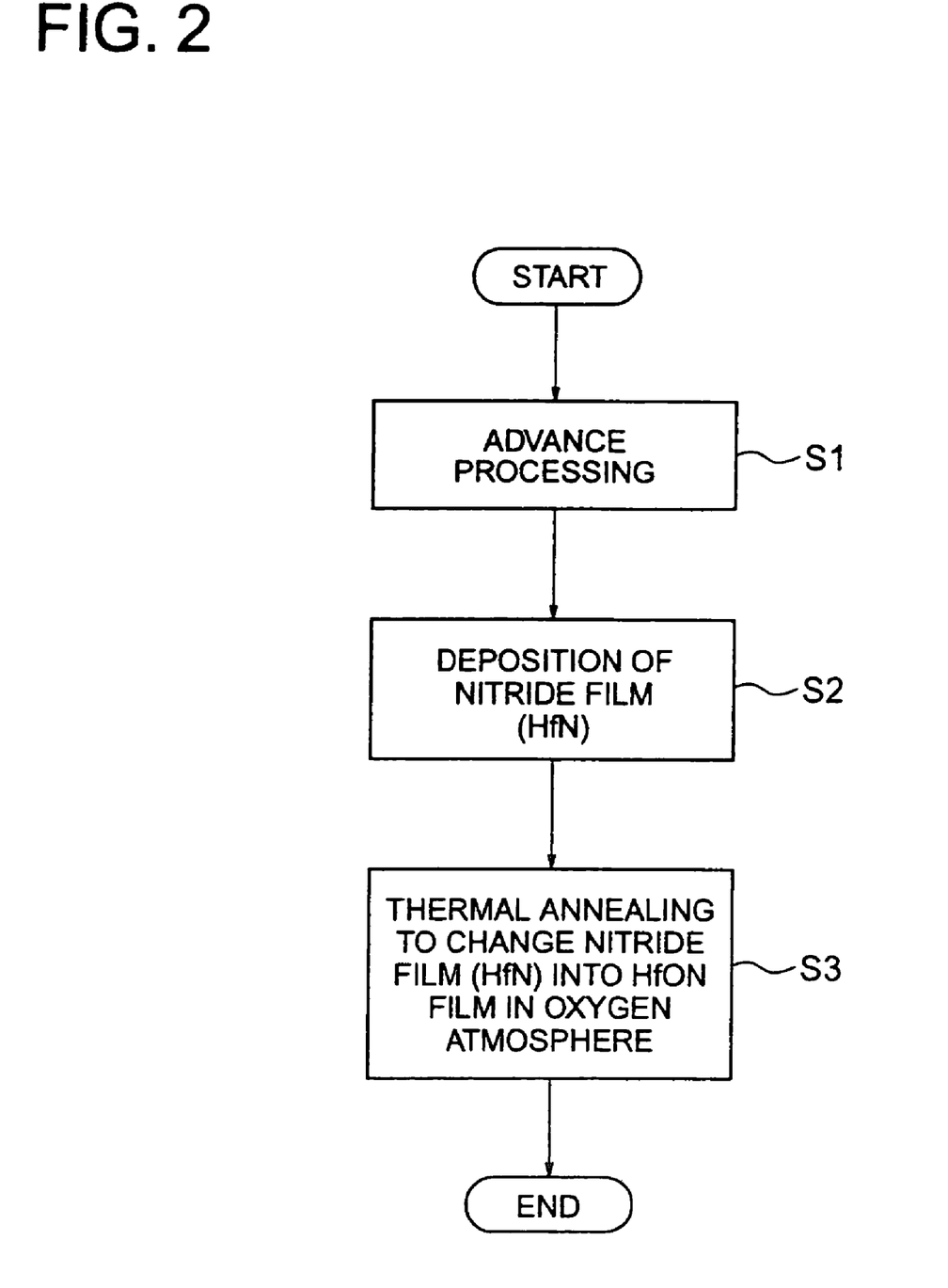
FIG. 2 illustrates a process for forming a high permittivity dielectric film as a gate insulation film.

Next, the method or process of depositing the high permittivity dielectric film on the wafer 11 carried out in the above-mentioned PVD process chamber is explained in detail in reference to FIG. 2.

The high permittivity dielectric film is formed on the surface of doped silicon (p-Si, n-Si) or doped silicon compound (doped SiGe: p-SiGe, n-SiGe, for example) wafer 22. The high permittivity dielectric film is used for the gate dielectric layer of MOSFETs in the CMOS devices fabricated on the wafer 22. It is very thin dielectric film with a higher permittivity larger than that of $SiO_2$.

As a process gas, Ar and $N_2$ are introduced to the process chamber 10 through the gas inlet 17. The inside pressure within the process chamber 10 is preferably maintained below 0.5 Pa. Sputtering is carried out by applying the DC electric power to the Hf target 12.

When carrying out the sputtering using the Hf target 12, the process chamber 10 has been introduced with a nitrogen ($N_2$)/Argon (Ar) mixture gas beforehand. Since there is the element of $N_2$ in the PVD process chamber 10, sputtered atoms Hf react with nitrogen radicals/ions and form HfN (nitride hafnium) film or layer on the surface of the wafer 22. A base material of the wafer 22 is silicon. The HfN film is formed on the doped silicon layer or SiGe etc.

The Hf-base high permittivity dielectric film forming procedure goes as follows.

(1): a wafer (the above-mentioned wafer 22) is cleaned in diluted HF solution to remove native silicon oxide (Step S1).

(2): Dry the wafer (Step S1).

(3): Deposit the HfN film on the wafer by reactive sputtering technique (Step S2).

(4): Anneal the wafer at a higher temperature over 400° C. in an almost inert gas or $N_2$ environment where oxygen content is about 1% (Step S3).

First, the wafer is cleaned in a diluted HF solution to remove natural oxides and other dirt on the wafer surface and dried (Step S1). Secondly, the HfN film is deposited on the wafer surface by the reactive sputter deposition technique (Step S2). For the HfN deposition above-mentioned PVD process chamber 10 is used. Thirdly, the wafer is subjected to thermal annealing at a higher temperature over 400° C. (Step S3). The annealing pressure is not critical and can be varied from several Torr to atmospheric pressure. The annealing gas environment is almost an inert gas or $N_2$ gas, with about 1% of oxygen. Through the annealing process, the oxidization is carried out to the HfN film and the HfN film is changed to be a HfON film as a high permittivity dielectric film.

In the above process of depositing or forming the high permittivity dielectric film using the Hf target 12, which is very thin and used as a gate dielectric, the hafnium (Hf) and nitrogen (N) in the nitride film ($Hf_xN_y$) have a relationship that $0<y<1.5$ for $x=1$.

After the above-mentioned film preparation, a TaN film is deposited on the HfN film as the gate electrode, patterned and etched to form metal-oxide-semiconductor (MOS) capacitors on the wafer 22. The CV (capacitance-voltage) and IV (current-voltage) properties of these MOS capacitors were investigated and estimated equivalent oxide thickness (EOT) and leakage current.

Figure 3A:
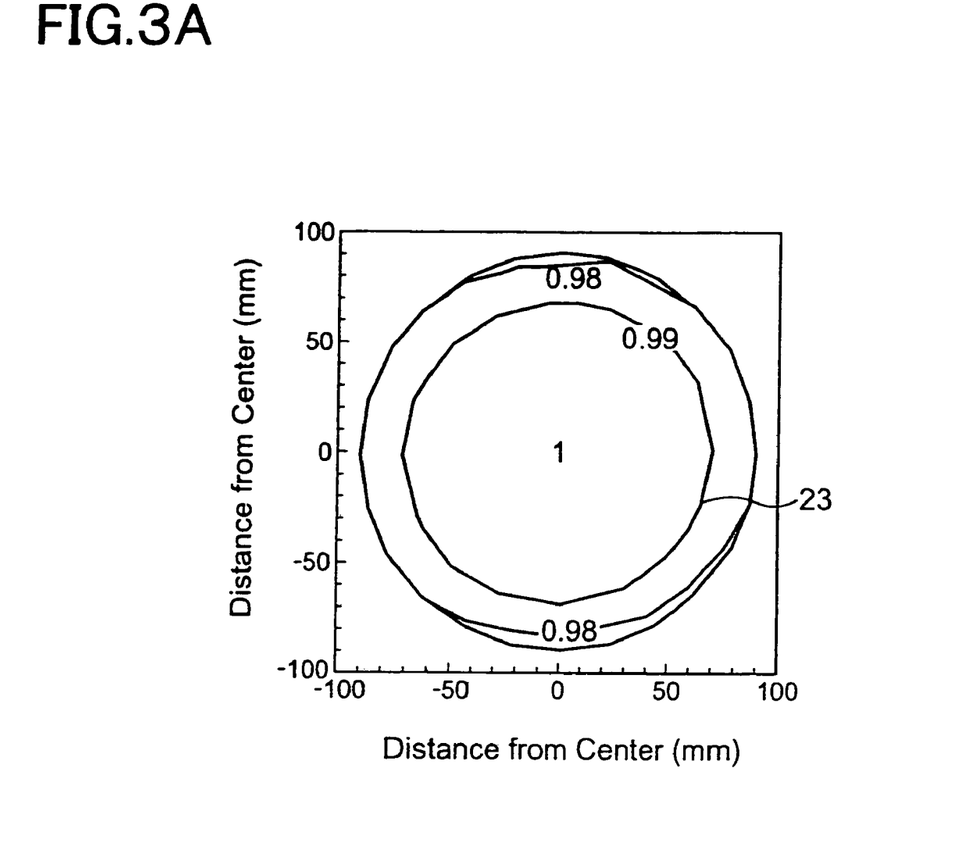
FIG. 3A is a plan view of the wafer showing the film thickness.
Figure 3B:
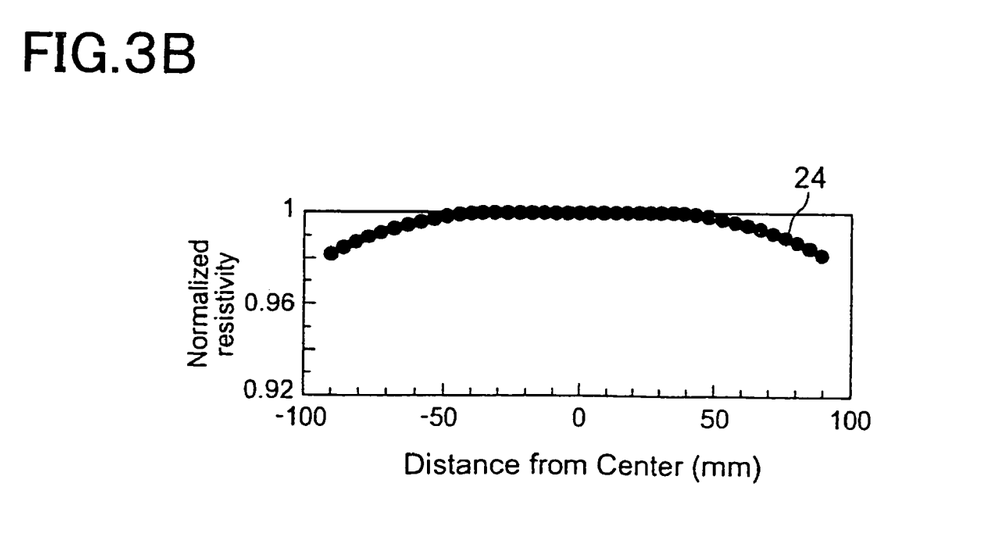
FIG. 3B is a longitudinal view (B) in a diameter line showing the normalized resistivity of the film.

The above-explained hardware yields extremely uniform film over 200 mm or 300 mm diameter wafers. FIGS. 3A and 3B show the HfN film uniformity on a 200 mm wafer. FIG. 3A is a plan view of the wafer showing the film thickness and FIG. 3B is a longitudinal view in a diameter line showing the normalized resistivity of the film. The film thickness is monitored on 49 points distributed over 180 mm surface area and estimated the standard deviation (σ) as 0.95%. The standard deviation represents the film non-uniformity. In FIGS. 3A and 3B, a reference number 23 designates uniformity contour lines and a reference number 24 designates a characteristic line formed by resistiviy data.

Figure 4:
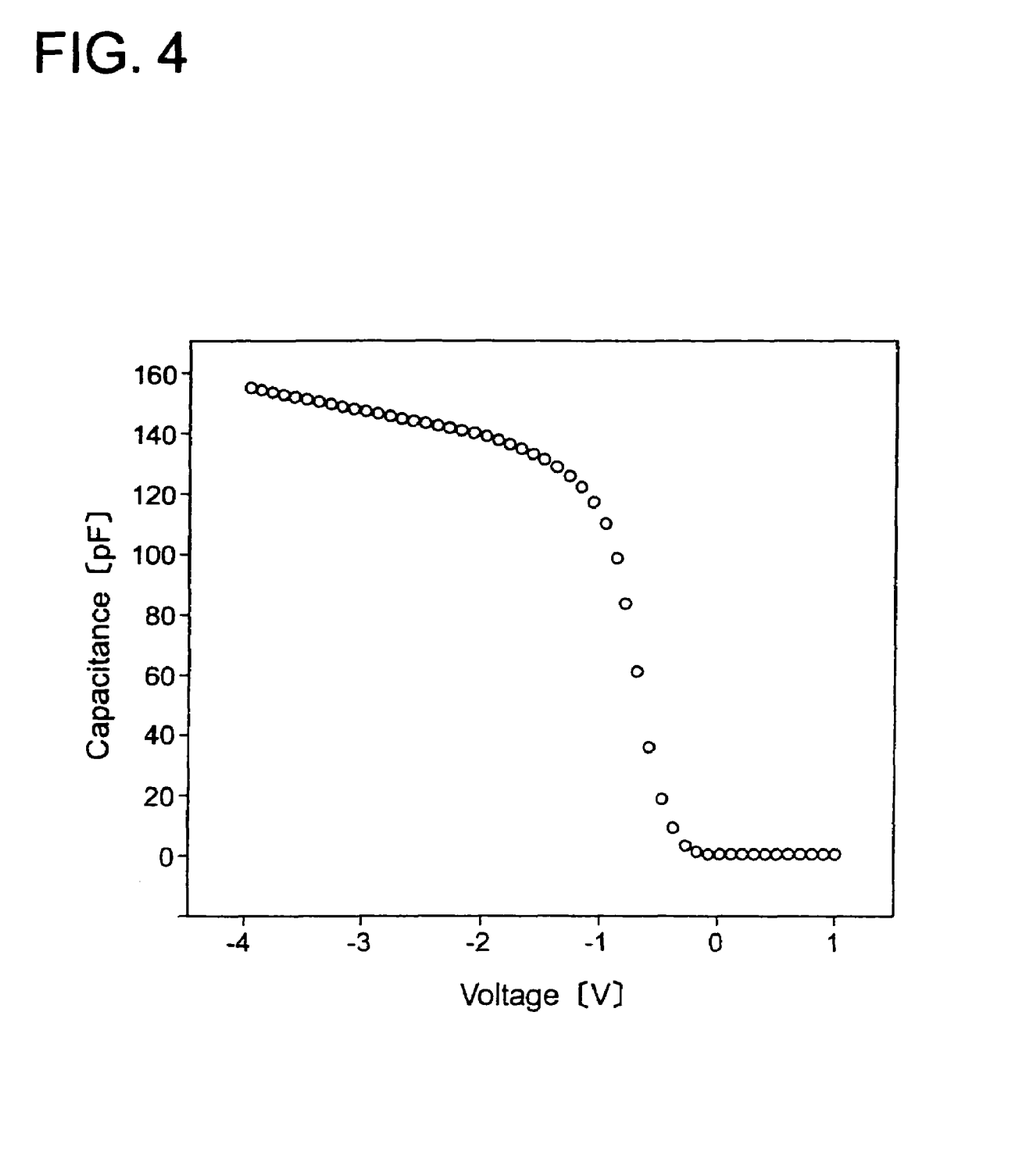
FIG. 4 is a characteristic graph showing CV data obtained for the resulted dielectric film.
Figure 5:
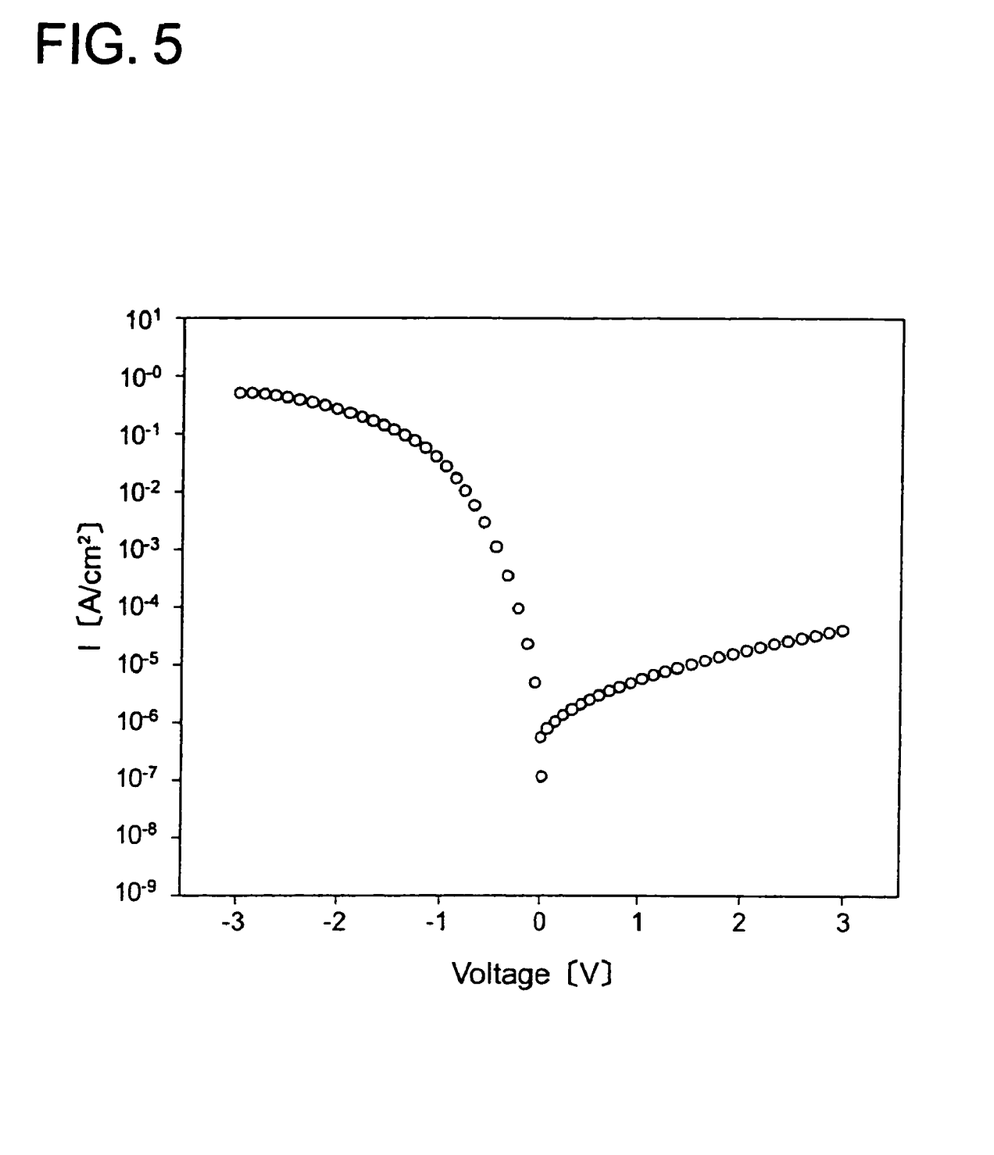
FIG. 5 is a characteristic graph showing IV data obtained for the resulted dielectric film.

FIGS. 4 and 5 show electrical data as to the prepared Hafnium oxy-nitride film (HfON) obtained with the procedure explained before. Those HfON films are deposited with the following process and film parameters.

| Pressure | 0.019 Pa |
|---|---|
| Ar gas flow rate | 20 sccm |
| N$_2$ gas flow rate | 6 sccm |
| DC power | 300 W |
| Deposition rate | 2.4 nm/min |
| Deposition time | 12.5 sec. |
| HfN film thickness | 0.5 nm |
| HfN film resistivity | 516 μΩcm |
| HfN film uniformity | 0.95% (1σ) |

Figure 6:
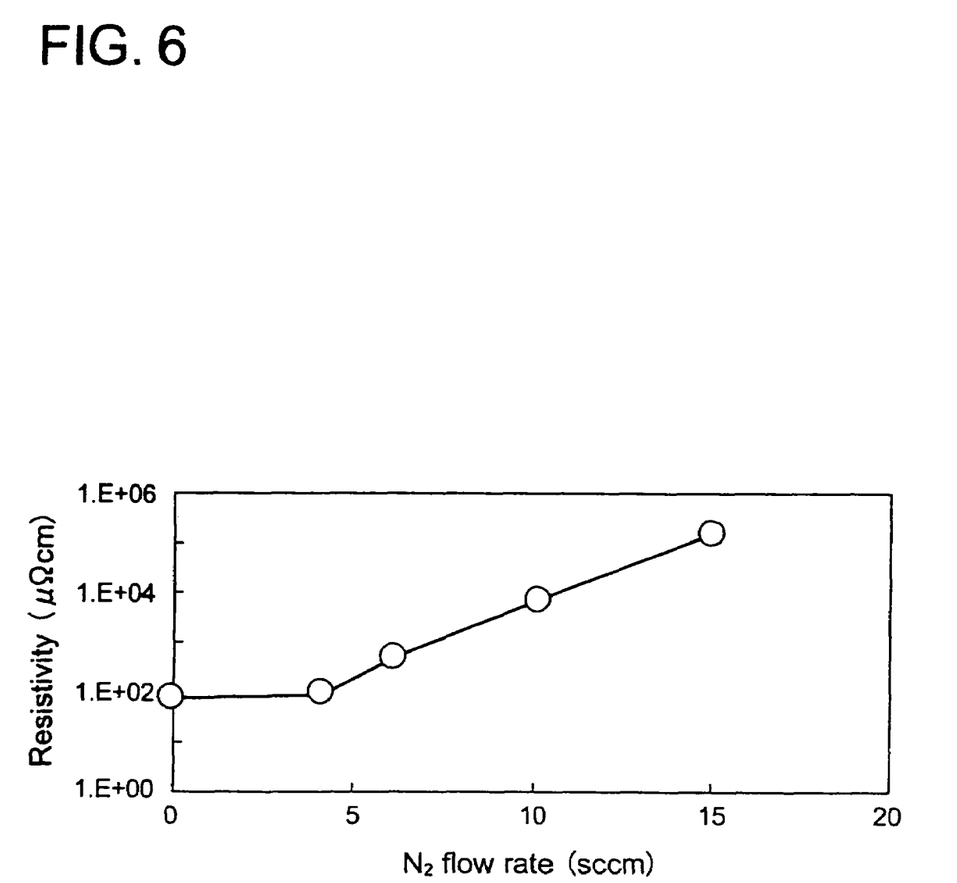
FIG. 6 is a characteristic graph showing the variation of HfN resistivity against the nitrogen flow rate introduced into the process chamber.

FIGS. 4 and 5 show CV and IV characteristics of the prepared film, respectively. In this case, the original HfN film thickness that is before thermal annealing, is 0.5 nm. The thermal annealing is carried out at 600° C. for 30 sec in N$_2$ and O$_2$ (~1%) gas mixture under atmospheric pressure. The deposited HfN shows metallic properties having a low resistivity. The resistivity of the HfN film varies with the nitrogen content in the film. FIG. 6 shows the variation of HfN resistivity as a function of nitrogen flow rate introduced into the process chamber 10.

As shown in FIGS. 4 and 5, the resultant film (HfON) after the thermal annealing process shows dielectric properties. The resultant film becomes a high permittivity dielectric film with very thin thickness. Therefore, during the thermal annealing, HfN film satisfied with the above-mentioned condition as reacted with oxygen and formed HfON (molecular nitrogen has no reaction with HfN at 600° C.).

Again, at the Si/HfN interface, Si reacts with oxygen, which is coming through HfON film and forms a very thin layer of SiO. At this higher temperature, Hf and Si can mix at the vicinity of the interface and form HfSiON. Accordingly, the resulted film contains HfON, HfSiON and SiO. The EOT and leakage current estimated for the film shown in FIGS. 4 and 5 are 0.95 nm and 0.03 A/cm$^{-2}$, respectively. The leakage current is estimated at −1.2 V, that is −1 V from V$_{fb}$ (flat-band voltage) of −0.2 V.

The extent of Si oxidation and intermixing between Si and Hf depend on annealing temperature and time. Depending on the initial HfN thickness, one has to find optimized annealing temperature and time to get the lowest EOT and/or lowest leakage current.

During the deposition process, the vertical distance between the center of the Hf target 12 and the wafer holder 11 is 300 mm. The plasma generated by DC electric power is basically confined at the vicinity of Hf target 12 by the strong magnetic field. Due to these two reasons, the plasma density over the wafer surface is negligibly smaller. Thus, the film deposition with the above-mentioned hardware can be considered as remote plasma deposition. Owing to these facts, the films deposited on the wafer 22 are not subject to plasma induced damages. This is further confirmed by CV and IV measurements, wherein there is no evidence for plasma-induced damages to the film.

As the modifications of the first embodiment, it should be noted, that one can use a different metal or metal nitride as the initial film in obtaining gate dielectric instead of the above hafnium (Hf). The different metal is preferably a specific element that belongs to third, fourth or fifth family of a periodic table of the elements. The examples as to the specific element are Zr, La, Ti, Ta and the like. When indicating the specific element as a symbol "A" in general, the deposited nitride material is expressed as $A_xN_y$. In this case, the specific element (A) and nitrogen (N) in the nitride film ($A_xN_y$) have a predetermined fraction relationship between x and y. Concretely, y is smaller than its stochiometric value as to the nitride film ($A_xN_y$).

Also one can use heavily doped poly-Si as the metal gate. Moreover, instead of one type of material, one can used a combination of different metal/metal nitride as the metal gate. Depending on the type of metal gate material, the flat-band voltage shift and metal gate work function of the fabricated MOS device changes.

Embodiment 2

Next, the second embodiment of the present invention is explained. The feature of the second embodiment is in the film preparation procedure. This film preparation procedure in the second embodiment is as follows.

(1): A wafer is cleaned in diluted HF solution to remove native silicon oxide.
(2): Dry the wafer.
(3): Thermal annealing over 500° C. in NH$_3$ gas environment.
(4): Deposit HfN by the reactive sputtering technique.
(5): Anneal the wafer at a higher temperature over 400° C. in an almost inert gas or N$_2$ environment where oxygen content is about 1%.

In the second embodiment only the initial wafer preparation before HfN film depositing has been changed compared to the first embodiment. As explained above, the wafers are subjected to a thermal annealing in NH$_3$ gas ambient after cleaning in diluted HF solution and before HfN deposition. During this annealing process a thin layer of silicon nitride (SiN$_x$) is formed on the wafer surface. Typically, annealing time and temperature is controlled to have a silicon nitride film less than 1 nm thickness. However, this is not a critical requirement. This silicon nitride layer suppresses oxygen diffusion to the Si wafer 22 during post deposition annealing. Oxygen diffusion to the Si wafer 22 causes formation of SiO$_2$ and thereby an increase of EOT. Accordingly, the silicon nitride layer assists to minimize EOT of the resultant film.

Except the above-mentioned additional step, all the other processing steps and the configuration of the processing system in the second embodiment are the same as those explained in first embodiment.

Embodiment 3

Next, the third embodiment of the present invention is explained. The feature of the third embodiment is also in the film preparation procedure. This film preparation procedure in the third embodiment is as follows. In the third embodiment, only the initial wafer preparation method is changed.

(1): A wafer is cleaned in diluted HF solution to remove native silicon oxide.
(2): Dry the wafer.
(3): Deposit very thin layer of $SiO_2$ or SiON or $Si_3N_4$ by CVD or RTP process which is called as underlayer.
(4): Deposit HfN by the reactive sputtering technique.
(5): Anneal the wafer at a higher temperature over 400° C. in an almost inert gas or $N_2$ environment where oxygen content is about 1%.

The $SiO_2$, SiON or $Si_3N_4$ layer deposited by CVD or RTP is usually kept around 1 nm or smaller. The use of this layer is to improve electrical characteristics of the final composite dielectric material.

Except the above-mentioned differences, all the other film preparation method is the same as those explained in the first embodiment.

Figure 7:
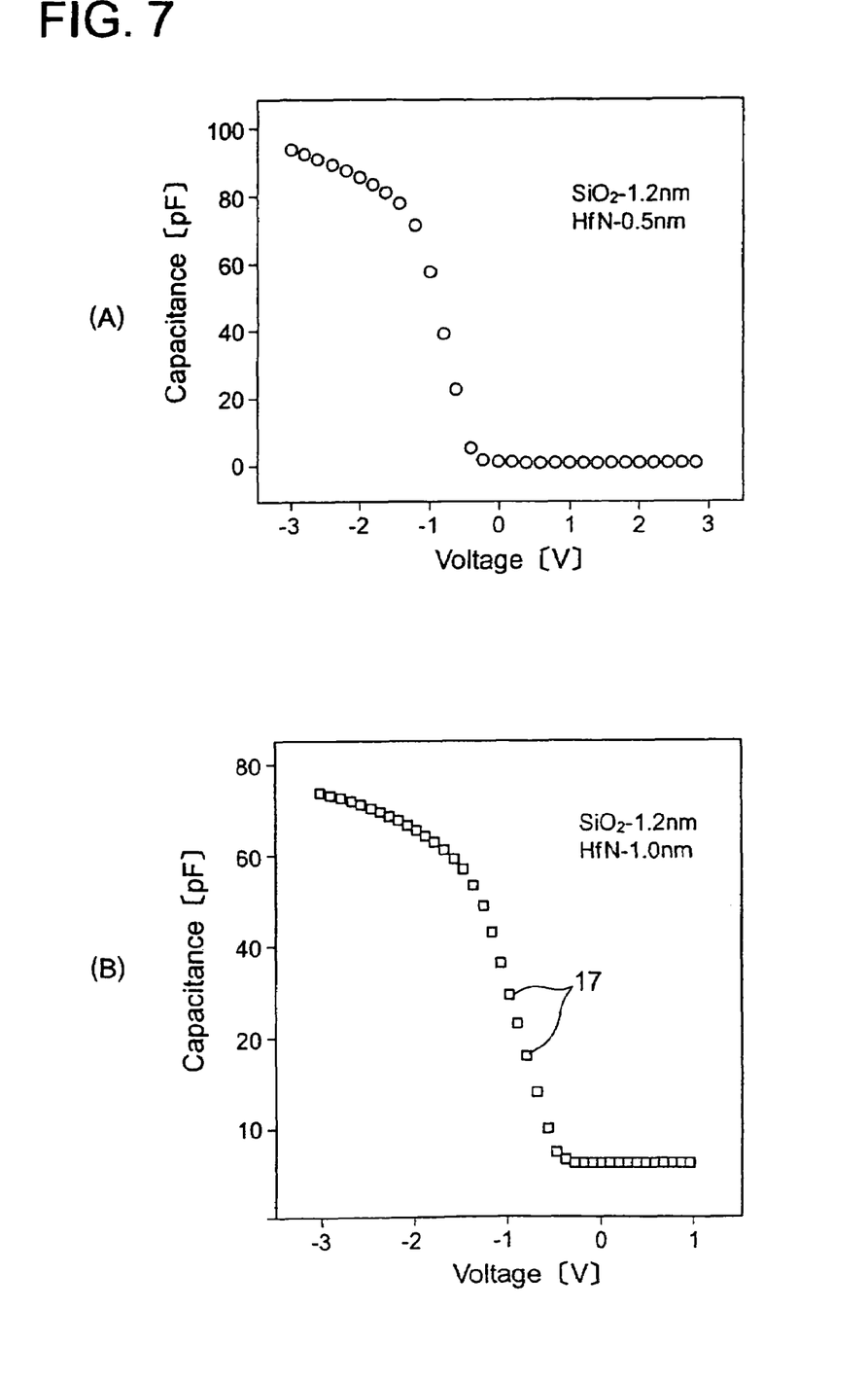
FIGS. 7A and 7B are characteristic graphs showing CV curves for final dielectric films wherein underlayer is 1.2 nm $SiO_2$ and HfN thickness is 0.5 nm and 1 nm.
Figure 8:
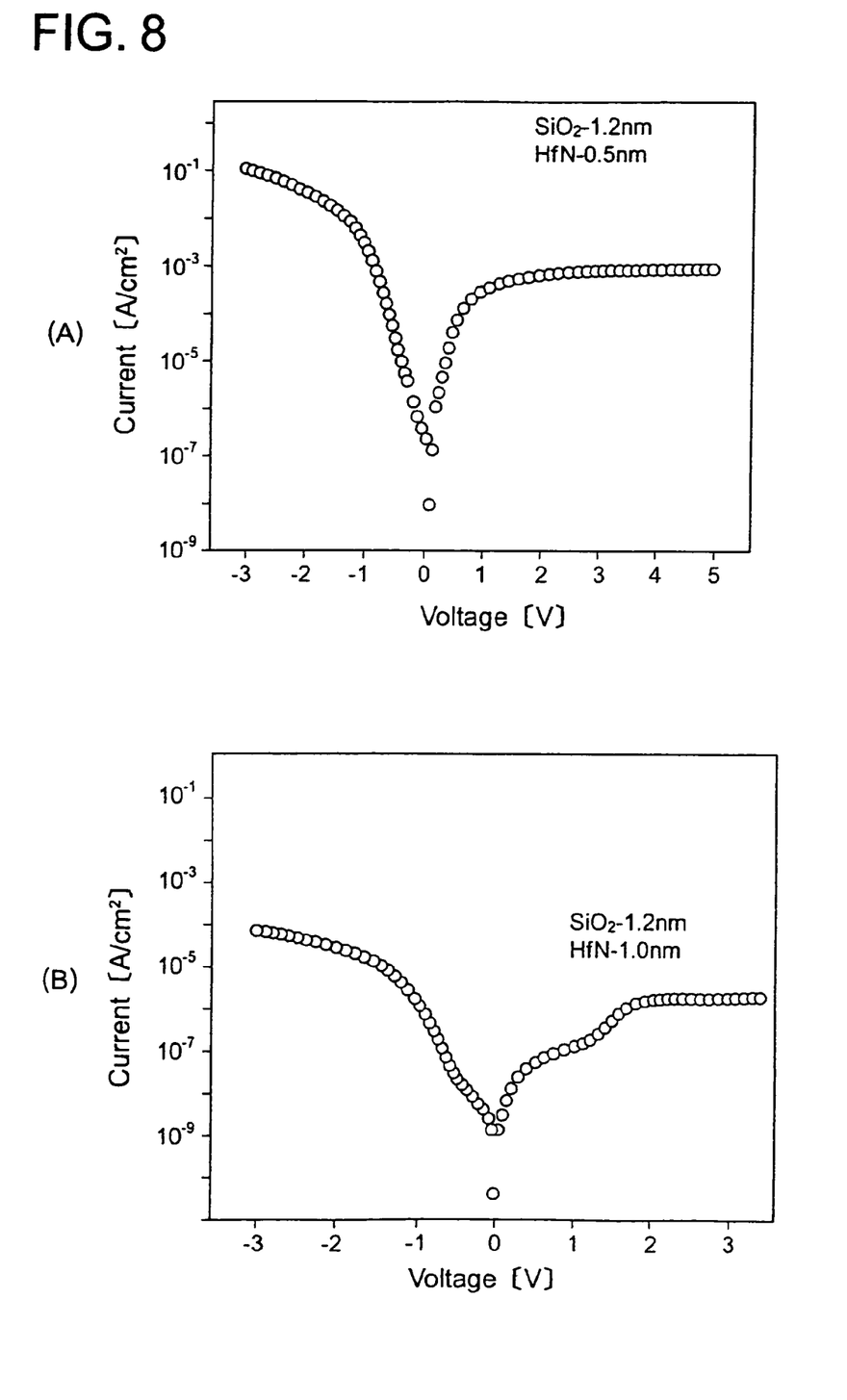
FIGS. 8A and 8B are characteristic graphs showing IV curves for final dielectric films wherein underlayer is 1.2 nm $SiO_2$ and HfN thickness is 0.5 nm and 1 nm.
Figure 9:
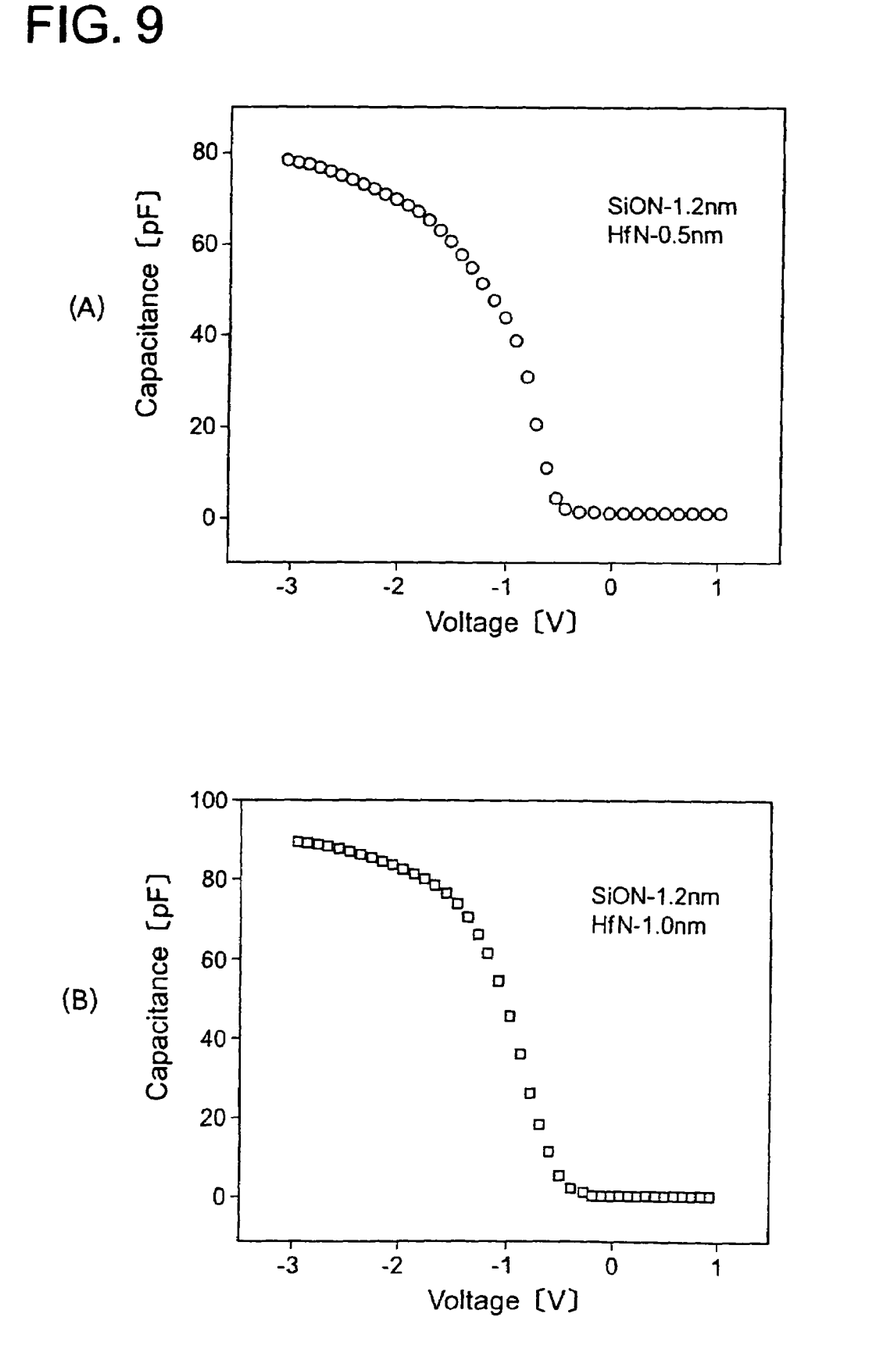
FIGS. 9A and 9B are characteristic graphs showing CV curves for final dielectric films wherein underlayer is 1.2 nm SiON and HfN thickness is 0.5 nm and 1 nm.
Figure 10:
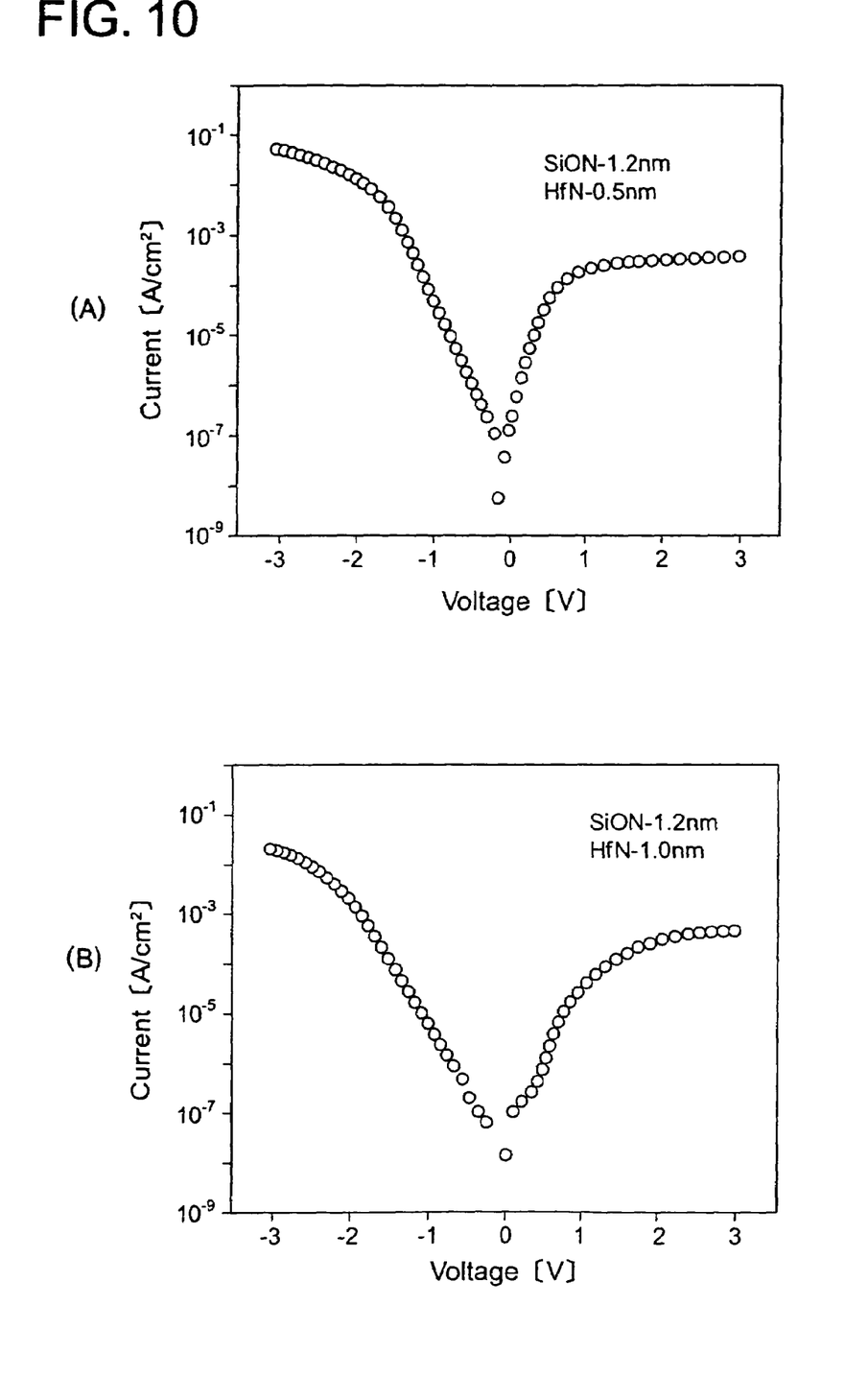
FIGS. 10A and 10B are characteristic graphs showing IV curves for final dielectric films wherein underlayer is 1.2 nm SiON and HfN thickness is 0.5 nm and 1 nm.

FIGS. 7 and 8 show CV and IV curves, respectively, for the resulted films in which the underlayer is $SiO_2$ with thickness of 1.2 nm. FIGS. 9 and 10 show CV and IV curves, respectively, for the resulted films in which the underlayer is SiON with thickness of 1.2 nm. These $SiO_2$ and SiON were deposited by RTP process. HfN was deposited on these wafers by the reactive sputtering under the condition given in the first embodiment. Then the films are thermally annealed at 900° C. for 30 sec. Thereafter, CV and IV data were measured using TaN metal gate electrode.

Figure 11:
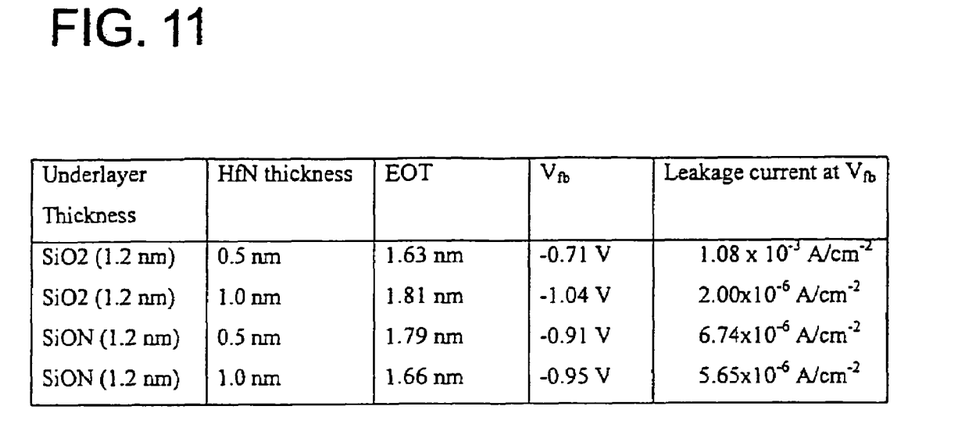
FIG. 11 is a table showing a summary of electrical properties of the specific films.

A summary of electrical properties of these films is indicated on a table shown in FIG. 11.

The post deposition annealing temperature and annealing time is critical in optimizing electrical properties. It should be noted that the above-explained annealing time and temperature are perhaps not the best condition. Also one can use a different annealing technique other than RTP method.

The present disclosure relates to subject matter contained in Japanese Patent Application No. 2004-160928, filed on May 31, 2004, the disclosure of which is expressly incorporated herein by reference in its entirely.

Although only preferred embodiments are specifically illustrated and described herein, it will be appreciated that many modifications and variations of the present invention are possible in light of the above teachings and within the purview of the appended claims without departing from the spirit and intended scope of the invention.

What is claim is:

1. A method of depositing a high permittivity dielectric film, the method comprises:
    forming an $SiO_2$ layer over a silicon substrate by heat treatment;
    nitriding a specific metal element (A) to form a nitride film ($A_xN_y$) on the $SiO_2$ layer, wherein said specific metal element (A) and nitrogen (N) in said nitride film ($A_xN_y$) have a predetermined fraction relationship between x and y, wherein a reactive sputtering method is used for the nitride film deposition such that metal (A) atoms from a metal target are sputtered in a nitrogen atmosphere; and
    annealing said nitride film in an oxygen atmosphere to form said dielectric film (AON) which is oxidized and nitrided, wherein the annealing is at a temperature of 400-1000° C., such that the oxidizing and annealing occur at the same time, wherein the entire annealing process is carried out in an oxygen atmosphere,
    wherein said specific metal element (A) and nitrogen (N) in said nitride film ($A_xN_y$) have a relationship that y is smaller than its stoichiometric value throughout the entire nitride film,
    wherein the high permittivity dielectric film is a gate dielectric layer.

2. The method of depositing a high permittivity dielectric film according to claim 1, wherein said specific metal element (A) is any one which belongs to the third, fourth, or fifth family of the periodic table of the elements.

3. The method of depositing a high permittivity dielectric film according to claim 2, wherein said specific metal element (A) is hafnium (Hf).

4. The method of depositing a high permittivity dielectric film according to claim 3, wherein said hafnium (Hf) and nitrogen (N) in said nitride film ($Hf_xN_y$) have a relationship that 0<y<1 for x=1.

5. The method of depositing a high permittivity dielectric film according to claim 1, wherein the annealing process is carried out at a temperature of 600 to 1000° C.

6. The method of depositing a high permittivity dielectric film according to claim 1, wherein the $SiO_2$ layer is formed by a chemical vapor deposition (CVD) or rapid thermal processing (RTP) process.

7. The method of depositing a high permittivity dielectric film according to claim 1, further comprising a step of removing native silicon oxide of the silicon substrate by HF solution before forming the $SiO_2$ layer over the silicon substrate.

8. The method of depositing a high permittivity dielectric film according to claim 1, wherein the reactive sputtering method is carried out under condition that the metal target is disposed to be non-parallel to the silicon substrate, and a nitrogen gas and inert gas are introduced at pressure of 0.5 Pa and lower in a state of rotating the substrate.

9. The method of depositing a high permittivity dielectric film according to claim 1, wherein the high permittivity dielectric film has an equivalent oxide thickness of less than 1 nm.

10. The method of depositing a high permittivity dielectric film according to claim 1, wherein the high permittivity dielectric film has a leakage current less than $10^{-1}$ A/cm$^2$.

11. The method of depositing a high permittivity dielectric film according to claim 10, wherein the high permittivity dielectric film has an equivalent oxide thickness of less than 1 nm.

* * * * *